United States Patent
Rodgers et al.

(10) Patent No.: US 7,061,998 B1
(45) Date of Patent: Jun. 13, 2006

(54) METHODS AND APPARATUS FOR DOWNCONVERTING SIGNALS FROM INTERMEDIATE FREQUENCY TO BASEBAND

(75) Inventors: William Ellis Rodgers, Fort Wayne, IN (US); Terrance Wayne Charbonneau, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 884 days.

(21) Appl. No.: 10/062,522

(22) Filed: Feb. 5, 2002

(51) Int. Cl.
*H03D 3/00* (2006.01)
(52) U.S. Cl. .................................................. 375/334
(58) Field of Classification Search ................. 375/316, 375/322, 323, 329, 334, 377, 229, 340, 259, 375/271, 272; 329/300; 455/308, 309, 130, 455/296
See application file for complete search history.

(56) References Cited

U.S. PATENT DOCUMENTS

| 4,555,667 | A | 11/1985 | Cressey et al. |
| 4,669,095 | A | 5/1987 | Hall |
| 5,159,281 | A | 10/1992 | Hedstrom et al. |
| 5,272,448 | A | 12/1993 | Hedstrom et al. |
| 5,539,776 | A | 7/1996 | Subramanian |
| 5,633,895 | A | 5/1997 | Powell, II et al. |
| 5,640,427 | A | 6/1997 | Rainish |
| 5,696,796 | A | 12/1997 | Poklemba |
| 6,922,555 | B1 * | 7/2005 | Mohindra ................... 455/314 |

FOREIGN PATENT DOCUMENTS

WO     WO 0119047     3/2001

* cited by examiner

*Primary Examiner*—Pankaj Kumar
(74) *Attorney, Agent, or Firm*—Edell, Shapiro & Finnan, LLC

(57) ABSTRACT

A technique for down converting signals from an Intermediate Frequency (IF) input signal to Inphase (I) and Quadrature (Q) signal samples at baseband replaces power-consuming A/D converters and AGC circuits with a low-cost zero-crossing comparator. The comparator converts the IF signal to a hard-limited signal having one value when the IF signal is positive and another value when the IF signal is negative. I and Q samples are generated by performing the equivalent of multiplication of the hard-limited signal by $\cos(2\pi f_o * t)$ and $\sin(2\pi f_o * t)$. By sampling the hard-limited signal at a rate that is an integer multiple of the intermediate frequency and an even number greater than or equal to four, multiplication by $\cos(2\pi f_o * t)$ and $\sin(2\pi f_o * t)$ required to generate I and Q baseband signal components is greatly reduced. The I and Q samples are summed (or integrated) by binary up/down counters over one bit duration and then dumped. The dumped counter outputs are estimates of the lowpass filtered I and Q signal components.

69 Claims, 11 Drawing Sheets

METHODS AND APPARATUS FOR DOWNCONVERTING SIGNALS FROM INTERMEDIATE FREQUENCY TO BASEBAND

BACKGROUND OF THE INVENTION

1. Field of the Invention

The present invention pertains to a method and apparatus for down converting signals from an Intermediate Frequency (IF) input signal to Inphase (I) and Quadrature (Q) signals at baseband. In particular, the present invention pertains to a down conversion technique by which an IF signal is hard-limited and the hard-limited signal is digitally processed to form I and Q sampled signals at baseband.

2. Description of the Related Art

Down conversion is the process by which a radio frequency (RF) signal is stripped of its high frequency carrier wave to reveal the information carrying waveform embedded within. Needless to say, down conversion processes are implemented within virtually every radio, cell phone, two-way transceiver, pager, transponder and other devices that receive information propagated via RF signal. Received RF signals are downconverted to a form and frequency that can be manipulated using electronic components so that the information contained within can be extracted and used.

In the first downconversion stage, the RF signal is physically received by an antenna designed for the nature of the physical waveform chosen by the transmitting device to propagate the embedded information signal. The RF signal is typically fed from the antenna as input to an RF tuner that mixes the RF frequency signal with a local oscillator (LO) signal specifically chosen so that the mixed signal, produced as output from the RF tuner, has a frequency significantly lower than that of the original RF signal, known as an Intermediate Frequency (IF). This IF signal is typically passed through a bandpass filter to eliminate extraneous components, thereby producing a filtered IF signal.

In the second downconversion stage, the filtered IF signal is further processed to generate In-Phase and Quadrature signals at baseband. Inphase (I) and Quadrature (Q) signals at baseband are typically generated by multiplying the Intermediate Frequency (IF) signal by $\cos(2\pi f_o * t)$ and $\sin(2\pi f_o * t)$ signals, where the frequency ($f_o$) is the center frequency of the desired signal in the IF passband.

It is well known among those schooled in the art that multiplication by sine and cosine signals can be greatly simplified, digitally, by choosing a sampling frequency that is four times the signal frequency in the IF passband. Hence, multiplication by $\cos(2\pi f_o * t)$ and $\sin(2\pi f_o * t)$ can be reduced to multiplication by the values 1, 0, −1, 0 or 0, 1, 0, −1 by making the sampling time correspond to $t=n*1/(4*f_o)$ where n is a positive integer (recall that the values of sine and cosine are 1, 0, or −1 at angles of 0, $\pi/2$, $\pi$, and $3\pi/2$ radians).

In terms of hardware used to implement IF to baseband down conversion, prior approaches generally use analog-to-digital (A/D) converters to digitize the IF signal into a sequence of samples, with the amplitude of each sample being represented by a binary number, typically consisting of at least twelve bits. If the sampling rate is four times the IF signal frequency, then the I and Q signals are formed by using every second sample for I and the alternate samples for Q. In addition, every other I and Q sample has its sign inverted to achieve multiplication by cosine and sine functions, as described above.

One shortcoming with this approach is that the A/D converter must sample at four times the IF signal frequency which, for most intermediate frequencies, requires a fast A/D converter. Such fast A/D converters are typically costly and consume considerable power. In addition, an automatic gain control (AGC) must be used prior to the A/D conversion to keep the IF signal within the A/D converter's dynamic range. These twelve-bit samples are then low-pass filtered, digitally, in an Application Specific Integrated Circuit (ASIC), Field Programmable Gate Array (FPGA), Digital Signal Processor (DSP) or similar device to produce the desired bandlimited I and Q output signals. A second shortcoming associated with the above approach is that twelve-bit sample precision greatly increases the complexity inside the programmable gate-array type devices typically used to perform the low-pass filtering. Besides requiring twelve bits per sample, such low-pass filters typically require twelve-bit multiply and add operations. Such operations require a large number of gates in FPGA and ASIC devices.

While the known approaches for down converting signals from an Intermediate Frequency (IF) input signal to Inphase (I) and Quadrature (Q) signals at baseband are operationally effective, they include many cost/performance inefficiencies. The circuits required to implement current IF to baseband down conversion are unnecessarily complex due to the need for AGC's, A/D converter's, and FPGA's, ASIC's and DSP's with large numbers of gates. This increased complexity not only increases production costs, but can also lead to increased production defects. Furthermore, greater circuit complexity leads to greater power consumption.

As a result, IF to baseband converters based upon the prior art approaches are disadvantageous for use in devices in which cost of production and/or device operational power consumption must be optimized. Such devices include a large number of military and commercial devices such as radios, pagers, cell phones, transponders used to monitor the status/location of resources, and other devices in which cost of production and/or and power consumption are key design considerations.

Hence, there remains a need for an IF signal downconverter capable of generating I and Q signals at baseband using circuitry of reduced complexity, power consumption, and cost.

SUMMARY OF THE INVENTION

Therefore, in light of the above, and for other reasons that become apparent when the invention is fully described, an object of the present invention is to simplify IF to baseband I and Q downconverter design, while retaining operational effectiveness in a wide range of devices and applications.

A further object of the present invention is to reduce the cost of producing IF to baseband I and Q downconverters, as compared to those produced in accordance with conventional designs.

Yet a further object of the present invention is to decrease IF to baseband downconversion circuit complexity.

A still further object of the present invention is to minimize circuit power consumption.

Another object of the present invention is to eliminate the need for multi-bit multiplication and addition calculations within a digital downconverter.

Yet another object of the present invention is to eliminate the need to perform automatic gain control (AGC) and the need to perform highly-quantized analog to digital conversion of the IF input signal.

Still another object of the present invention is to support IF to baseband down conversion at higher IF frequencies than is possible with traditional techniques using multi-bit A/D converters.

It is a further object of the present invention to allow the number of input stream samples summed to create each I and Q output sample to be automatically determined based upon the data rate (i.e., bits/second) of the input stream and the sampling frequency (i.e., samples/second).

It is yet a further object of the present invention to optimize tracking of bit boundaries.

The aforesaid objects are achieved individually and in combination, and it is not intended that the present invention be construed as requiring two or more of the objects to be combined unless expressly required by the claims attached hereto.

In accordance with the present invention, IF to baseband I and Q downconversion techniques known in the prior art are dramatically improved in several significant ways. The expensive, power-consuming A/D converter and associated AGC circuit are replaced with a low-cost, low-power zero-crossing comparator. The comparator creates a hard-limited signal at the IF signal frequency which is supplied to a digital signal processor implemented in an FPGA, ASIC or similar device. These 1-bit samples are processed to form I and Q signals but require a greatly reduced gate complexity relative to that required to process 12-bit samples.

Further, by sampling the hard-limited signal in one non-limiting representative embodiment at four times the IF signal frequency (i.e., where the time at sampling, t, corresponds to $t=n*1/(m*f_o)$ where n is a successively increasing positive integer representing the sample number, and where m=4), multiplication by $\cos(2\pi f_o*t)$ and $\sin(2\pi f_o*t)$ required to generate I and Q baseband signal components is reduced to multiplication by the values 1, 0, −1, 0 or 0, 1, 0, −1. Given that the IF signal itself has been hard-limited to two separate logical states or voltage levels (e.g., −1 and 1), the complex twelve bit multiplication operations which would ordinarily require complex gated logic to implement, can be reduced to simple gated logic.

Additionally, generated I and Q signal component samples may be decimated by an odd integer (e.g., 3, 5, 7, etc.), thereby greatly reducing the effort to perform subsequent lowpass filtering of the I and Q component signals.

Moreover, because the I and Q component samples generated in accordance with the present invention consist solely of the values 1, 0 and −1, low-pass filtering of generated I and Q signals, typically performed in the prior art using multi-bit multiplication and addition operations implemented within FPGA, ASIC, or DSP devices with heavy gate counts, can be performed with simple up/down counters.

As the result of these techniques, traditional IF to baseband I and Q downconversion is dramatically simplified without significant loss of performance. The need to perform automatic gain control (AGC) and to perform analog to digital conversion of the IF input signal is completely eliminated. Furthermore, the need for multi-bit multiplication and addition calculations is also eliminated. Circuit complexity is significantly reduced, yet the IF to baseband I and Q downconverter remains effective for a wide range of devices and applications. Cost of production and operating power consumption is significantly reduced due to greatly reduced circuit complexity, as compared to those produced in accordance with traditional designs. Furthermore, because the present invention does not require the use of an A/D converter, the downconversion techniques of the present invention may be used to downconvert signals at IF frequencies significantly higher than the IF frequencies supported by circuits which do require the use of an A/D converter.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DESCRIPTION OF THE PREFERRED EMBODIMENTS

Figure 1:
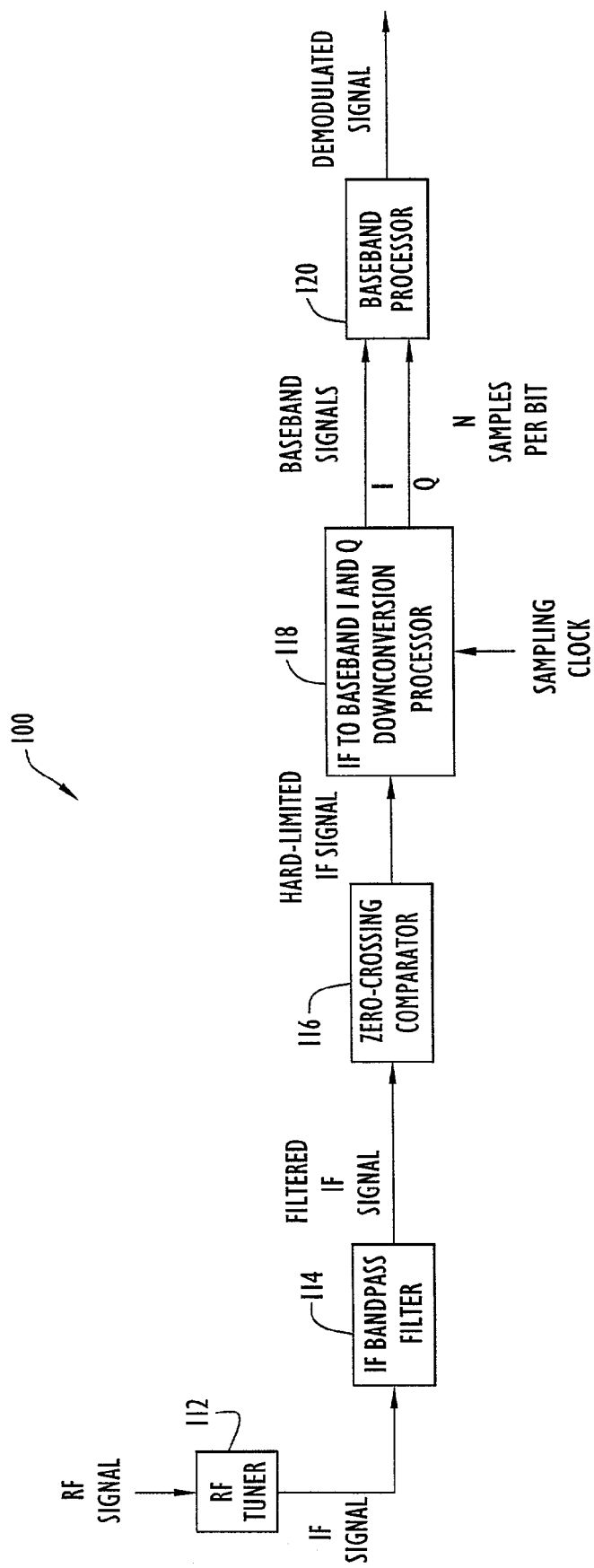
FIG. 1 is a top-level block-diagram representation of a receiver that incorporates a representative embodiment of a process for receiving and down converting a radio frequency (RF) signal to I and Q signal components at baseband, in which the area of focus of the present invention is specifically identified.

The following detailed explanations of FIGS. 1–4 and of the preferred embodiments reveal the methods and apparatus of the present invention. FIG. 1 depicts a receiver 100 that incorporates a representative embodiment of a high level process for down converting a radio frequency (RF) signal to baseband I and Q sampled signals. As indicated, an analog radio frequency (RF) signal is received by an RF tuner 112 and converted to an analog intermediate frequency (IF) signal, which is then passed through an IF bandpass filter 114 to create a bandpass filtered analog IF signal. Once a bandpass filtered IF signal has been created, a novel combination of signal processing operations is performed in accordance with the present invention, resulting in the generation of I and Q sampled signals at baseband. First, the filtered IF analog signal is supplied to a zero-crossing comparator 116, thereby producing a hard-limited signal at IF. Comparator 116 essentially compares the input IF signal to a predetermined threshold. According to the exemplary embodiment, when the input IF signal is above the threshold, the output hard-limited signal produced by the comparator has one voltage level, and when the input IF signal is below the threshold, the output hard-limited signal has a different voltage level. The term hard-limited refers to the fact that the received IF signal is, in effect, converted into a signal whose instantaneous amplitude is limited to certain values where, for example, the resulting signal takes on one value when the received IF signal is positive or greater than a small positive value, and takes on another value when the received IF signal is negative or below a small negative value. Thus, like the received IF signal, the corresponding hard-limited signal is substantially continuous in time, but unlike the received IF signal, the hard-limited signal has an amplitude that generally assumes one of a plurality of specific levels (e.g., in the exemplary embodiment, two levels which represent the sign of the IF signal's amplitude).

Referring again to FIG. 1, the hard-limited signal is digitally processed in processor 118 to generate I and Q sampled signals at baseband. The generated I and Q sampled signals at baseband are then further digitally processed by baseband processor 120 to produce a demodulated information signal at baseband. This digital processing may be performed by logic embedded in an FPGA, ASIC, DSP, or other hardware capable of processing a digital signal as disclosed herein with respect to the present invention. In fact, the IF to baseband I and Q conversion processor 118 and baseband processor 120 may be implemented upon the same or separate FPGA, ASIC, DSP or similar device.

Figure 2:
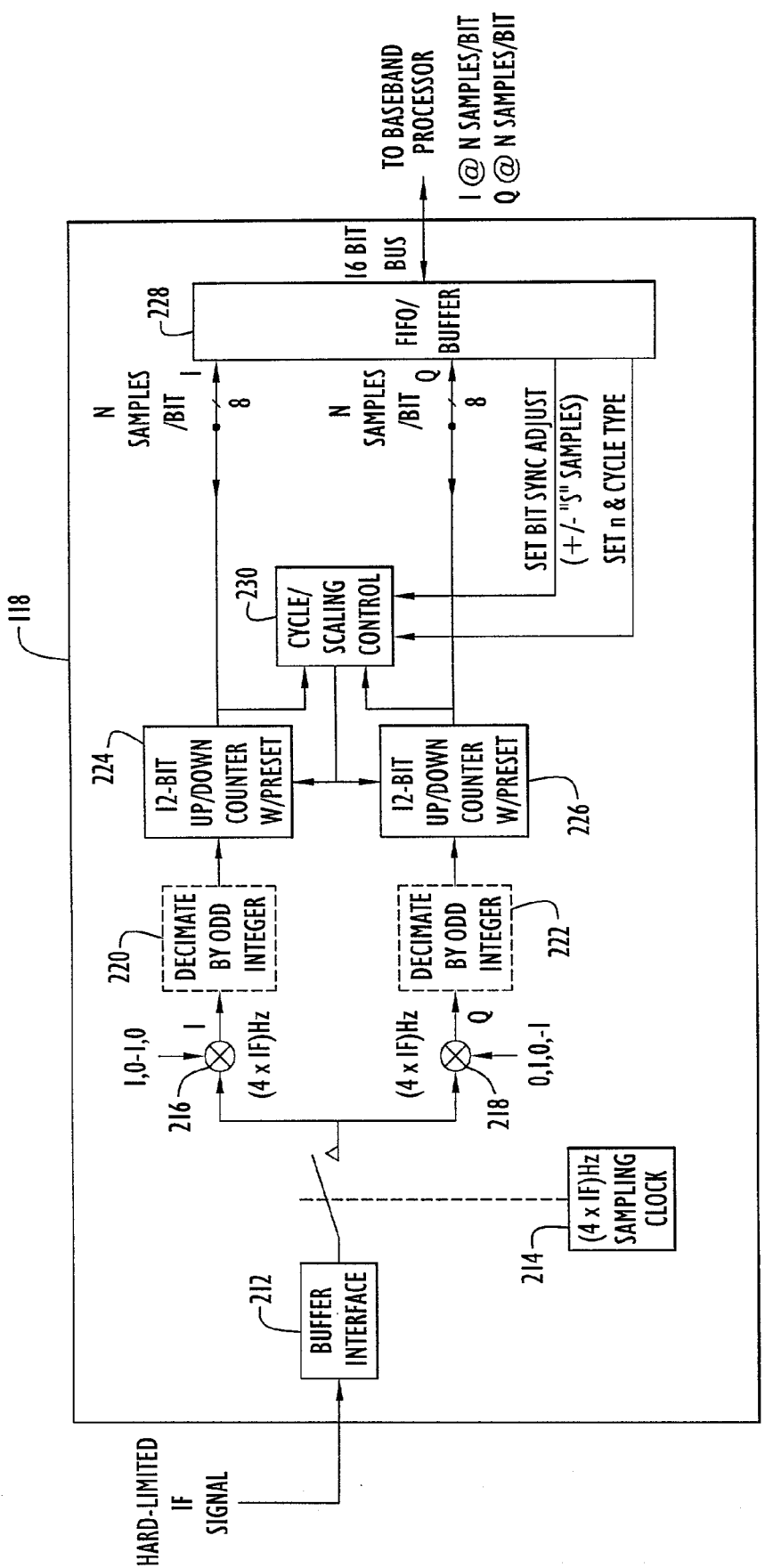
FIG. 2 is a detailed block-diagram showing a representative embodiment of the signal processing performed in accordance with the present invention to convert an analog IF bandpass signal to I and Q sampled signals at baseband, using a sampling rate of four times the intermediate frequency.

The digital processing performed upon the hard-limited output of zero-crossing comparator 116 to generate baseband I and Q sampled signals in accordance with an exemplary embodiment of the present invention is shown in FIG. 2. The digital signal processing described in relation to FIG. 2 may be performed within an FPGA, ASIC, DSP, or other hardware capable of processing a digital signal in accordance with the present invention. The hard-limited digital IF signal is received from the zero-crossing comparator via a digital buffer interface 212. The hard-limited signal is then sampled by a clock 214 at a sampling frequency which is the product of the intermediate frequency and an even integer number greater than or equal to four (i.e., where the time at sampling, t, corresponds to $t = n*1/(m*f_o)$ where n is a successively increasing positive integer representing the sample number, and m is an even integer greater than or equal to four) to create a sampled hard-limited signal. By way of non-limiting example, for a 455 kHz IF signal, if the value of m is set to four, the sampling rate is set to 1820 kHz. By way of a second non-limiting example, for a 455 kHz IF signal, if the value of m is set to six, the sampling rate is set to 2730 kHz.

Next, independent I and Q components are generated from the sampled hard-limited signal by performing an operation which is the digital equivalent of multiplying the sampled hard-limited IF signal by $\cos(2\pi f_o*t)$ to produce the digital I-component (represented functionally in FIG. 2 by multiplier 216) and multiplying the sampled hard-limited IF signal by $\sin(2\pi f_o*t)$ to produce the digital Q-component (represented functionally in FIG. 2 by multiplier 218). Assuming, by way of non-limiting representative embodiment that the hard-limited IF signal is sampled at four times the intermediate frequency, the process of multiplying the hard-limited IF signal by $\cos(2\pi f_o*t)$ and $\sin(2\pi f_o*t)$ is reduced to multiplication by the values 1, 0, −1, 0 and 0, 1, 0, −1, respectively.

As a result of the simplified processing achieved by sampling the hard-limited signal at four times IF, the multiplication processes suggested by multipliers 216 and 218 can be carried out without requiring any actual multiplication, and may be implemented, operationally, using any number of techniques. Since the samples of the hard-limited signal are in one of two states (e.g., "1" and "−1"), the samples can be treated as a binary logical signal. Likewise, at the selected sampling rate, since multiplication by sine and cosine amounts to multiplying by one of 1, 0, and −1, the multiplier can be treated as a logical signal having one of three states. Consequently, the "multiplication" to form the I and Q signals can be performed by simple gated logic which receives the sampled hard-limited signal as one input and the "multiplier" as another input and generates the appropriate output in accordance with the two input values. When the multiplier is 1, the output is simply the input sample value; when the multiplier is −1, the sign of the sample value is inverted to yield the output; and when the multiplier is 0, the output is 0. More particularly, I samples are generated using gated logic to successively pass, zero, invert, and zero (i.e., conceptually multiply by 1, 0, −1, or 0) the hard-limited logical state of each successive IF input signal sample. Similarly, Q samples are generated using gated logic to zero, pass, zero, or invert (i.e., conceptually multiply by 0, 1, 0, or −1) the hard-limited logical state of each successive IF input signal sample. In other words, the multiplication in each of the I and Q channels amounts to zeroing alternate samples and changing the sign of alternate non-zeroed samples.

Referring again to FIG. 2, after the creation I and Q components, the number of digital samples associated with each sampled I and Q component can be optionally decimated (220 and 222, respectively) by one, three, five or other odd integer. For example, decimation-by-three means that every third value is kept or used in the calculation. Decimation-by-five means that every fifth value is kept or used in the calculation. Accordingly, decimation-by-one means that every value is kept or used in the calculation, and in effect represents no decimation at all.

Decimation reduces the number of samples manipulated in subsequent digital processing, and thereby reduces the complexity and speed required of the subsequent processing hardware. For example, smaller up/down counters are needed to support integration and up/down counter clock rates are reduced in direct proportion to the decimation rate. Furthermore, less complex components use fewer gates and therefore require less power.

Once an I or Q component sample sequence has been generated and optionally decimated by some fraction of its samples, low-pass filtering of the I and Q component samples is performed using up/down counters (224 and 226, respectively) to integrate the I and Q components by summing their respective component sample values over a period of time related to the bit period. The bit period defines the period of time, or number of signal samples, used by the IF signal to represent a single information value, or bit. In the case of the I component, for example, the components are summed by the up/down counter for the period of time or for the number of samples assigned to the bit period. An identical approach is used to simultaneously process the Q component. Upon completion of the summation for each bit period, the resulting I and Q sums are dumped to a First-In-First-Out (FIFO)/buffer module 228.

The sum and dump operation serves as a digital low-pass filter, for the up/down counter has a maximum counter value which determines the maximum output of the counter. If either the I or Q component up/down counter approaches its maximum value, both I and Q counters can be right shifted (i.e., divided by a multiple of two) to assure that the largest value remains below the upper range of the respective up/down counter. In this manner, the I and Q output values remain proportional and I and Q phase information is retained. An alternate, non-limiting example, which demonstrates the usefulness of dividing summed I and Q values by multiples of two, is that of a downconverter design that requires that each generated I–Q sample pair fit within one sixteen-bit DSP word comprised of two eight-bit signed values (i.e., wherein each I and Q value is comprised of a one-bit sign and a seven-bit magnitude). If the magnitude of any I or Q related sum were to exceed one-hundred-twenty-seven (i.e., the maximum value that can be represented with seven bits), both I and Q values can be right-shifted by one until the maximum value fits within its required seven-bit format. Each right shift constitutes a division by two. By dividing I and Q samples by multiples of two in such a manner, as a pair, I and Q phase information is preserved even when only one sample magnitude is greater than one-hundred-twenty-seven.

The present invention is not limited to dumping the summed values in any particular format, or at any particular point in time in the summation process. Nor is the present invention limited to the numbers of counters that can be simultaneously employed to generate multiple sums per bit period from a single I or Q component signal stream. For example, in one lowpass filter implementation, the non-zero I and Q samples are summed (or integrated) individually by multiple binary up/down counters over one bit duration and then dumped. The dumped counter outputs are estimates of the lowpass filtered I and Q signals. An alternate yet equally effective embodiment may choose to sum (or integrate) I and Q samples over a fraction of the bit period (i.e., bit period/N), and thereby output I and Q samples at a rate of N samples per bit period. The N summed values generated for each I and Q component are then themselves summed to form one lowpass filtered I sample and one lowpass filtered Q sample that span one bit period.

The summation and dump approach selected from the above non-limiting embodiments for implementation within any specific downconverter design is based, primarily, upon hardware design considerations. If I and Q are summed over a fraction of a bit period the size of the counters required is reduced by a factor of N in size and there is no need for parallel counters on the respective I and Q processing paths. For example, ten parallel counters used to produce five I and five Q samples per bit period can be reduced to two parallel counters (i.e., one for I and one for Q, respectively). However, the results of N counts must be later added to produce an output sample. If I and Q are summed over a whole bit period no adder is required, but the counters must be larger. Alternatively, one can eliminate the adder in the N counter approach by outputting the I–Q samples to the I and Q baseband processor (see FIG. 1, 120) N times faster and performing the addition as part of the signal demodulation process.

One other consideration, with respect to the number of counters and the summation and dump approach selected, is that the more samples per bit period from the I and Q components, respectively, the easier it will be to perform message synchronization at the beginning of signal reception (i.e., when bit timing is unknown). During message synchronization, the receiver parses incoming signals to determine whether the signal contains bit pattern that matches the synch pattern stored within the receiver. A sync pattern match occurs when the reference pattern in the receiver matches the incoming pattern to the number of required matches set by the designer to constitute a detection. Examples of synchronization patterns are maximal-length sequences, gold codes, kasami codes, etc. If multiple counters are used in parallel to sum samples for each of the I and Q signal components, respectively, each counter may be slightly offset in time thereby creating a greater likelihood that the results from one of the counters will result in a pattern match. For example, creating two samples per bit assures that one of the generated output streams will see >50% of the energy in the sync pattern. Hence, for the worse case timing case, the two samples/bit scenario would requires 50% more energy in the transmitted sync pattern. However, by creating and processing a greater number of samples/bit, for example five samples/bit, the worse case timing only produces an approximate 10% energy loss and would thereby require only 10% more energy in the transmitted sync pattern. Once, the sync pattern is acquired, the extra samples can be used to monitor alignment of the I and Q output samples with respect to the input stream and to correct, via the bit sync adjust feature, for any timing discrepancies that may develop between the transmitting and receiving radios.

The nature of the FIFO/buffer module (228) can be tailored to meet the needs of subsequent processing of the respective I and Q sampled signals. In one embodiment, it may be desired that the I and Q component values be output from the FIFO storage as a combined 16-bit binary value. As previously discussed, in such a case the summed I and Q component value can be represented as a signed seven-bit value (i.e., an eight bit value). Depending upon the nature of subsequent signal processing to be performed on the respective I and Q components, performance criteria or implementation constraints, summed I and Q component values may be output in many different formats. For example, I and Q components can be output as separate information streams, and/or represented as other than eight bit values using various digital formats.

As addressed with respect to FIG. 1, a baseband processor 120, which can be implemented on the same DSP or a separate DSP, further digitally processes the I and Q sampled signals to produce a demodulated information signal. For example, the I and Q samples can be converted in baseband processor 120 to phase angles versus time to demoduate phase or frequency modulated signals. The change in phase between samples from two adjacent bits can be used to demodulate Differential Phase Shift Keying (DPSK) signals.

(It is also well-known by those skilled in the art that DPSK signals can also be demodulated using I–Q dot products without calculating the phase angle directly.) Alternatively, tracking phase angle versus time with the baseband equivalent of a Phase Lock Loop (PLL) can be used to demodulate Frequency Modulated (FM) signals, etc.

Again referring to FIG. 2, operation of programmable up/down counters 224 and 226 is controlled by a cycle and scaling control 230. The cycle and scaling control supports features which allow operation of programmable up/down counters to be dynamically adjusted to optimize operational performance. A bit sync adjust feature allows tracking between programable up/down counters and respective I and Q input streams to be advanced or retarded. To advance tracking, the bit sync adjust decreases the duration of the bit period for one cycle to allow a lesser number of input stream bits to be included in the bit period, thus advancing the tracking of the bit period with the input stream. To retard tracking, the bit sync adjust increases the duration of the bit period for one cycle to allow an additional number of input stream bits to be included in the bit period, thus retarding the tracking of the bit period with the input stream. Alternatively, additional zero samples could be inserted at the beginning of a sample to retard bit synchronization and input samples can be discarded at the beginning of a count to advance bit synchronization. The bit sync adjust can be controlled by the DSP to optimize signal tracking. For example, based on DSP processing of previous I and Q output samples, the DSP can instruct the processor to increase or decrease the number of samples summed for a single output sample in all I and Q counters.

The cycle and scaling control also supports a data rate adaptation feature. The data rate adaptation feature is controlled with a set n & cycle type control signal from the DSP. The data rate adaptation feature determines the number of bits to be associated with a single bit period based upon the sampling frequency and number of bits/second contained in the input stream. For example, with the sampling frequency at 1,820,000 samples/second and a data rate of 1,600 bits/second, there are 1,820,000/1,600=1137.5 samples/bit. By way of non-limiting example, the DSP first informs the cycle and scaling control process of the signal data rate and the adaptation function to be used via the "set n & cycle type" control signal. Next the cycle and scaling control process calculates the optimal number of input samples to be summed within each I and Q output sample and relays this information via control signals to the respective programmable up/down counters which then proceed with their respective sum and dump integration of I and Q samples, as previously described.

Different data rates and sample rate combinations require different data rate adaptation, as described above. By means of non-limiting example, a subset of all possible adaptation functions can be integrated within the cycle and scaling control process, based upon all expected input signal data rates and input signal sampling rates, and the DSP can specify the adaptation function to be used via the "n and cycle type" parameter based upon the input signal data bit rate and sampling frequency.

The exemplary IF to baseband downconverter of the present invention will now be described from an operational perspective in relation to FIG. 3 and the signal timing diagrams depicted in FIGS. 4A–4F. In particular, FIGS. 4A–4F present a series of signal timing diagrams depicting the sequential transformations that a representative filtered IF signal undergoes when processed in accordance with the signal processing operations shown in FIG. 3. Within FIGS. 4A–4F, dashed vertical synchronization lines, occurring every ¼ cycle (i.e., the examples assume sampling at four times the IF signal frequency) are used to correlate the respective signals in time and solid dots, at the intersection of the vertical synchronization lines and the signals they intersect, represent signal sample points (i.e., samples taken at four times the IF frequency).

Figure 3:
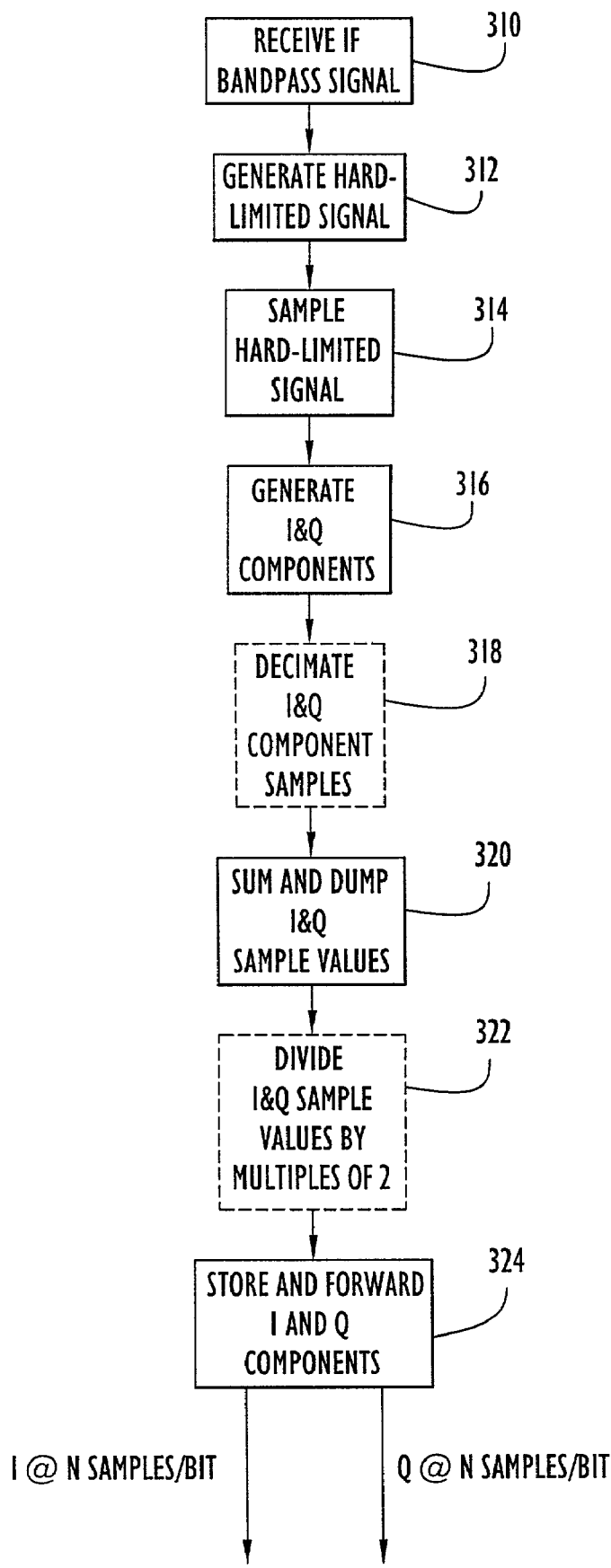
FIG. 3 is a flow diagram illustrating conversion of an analog IF bandpass signal to I and Q sampled signals at baseband in accordance with the present invention.
Figure 4:
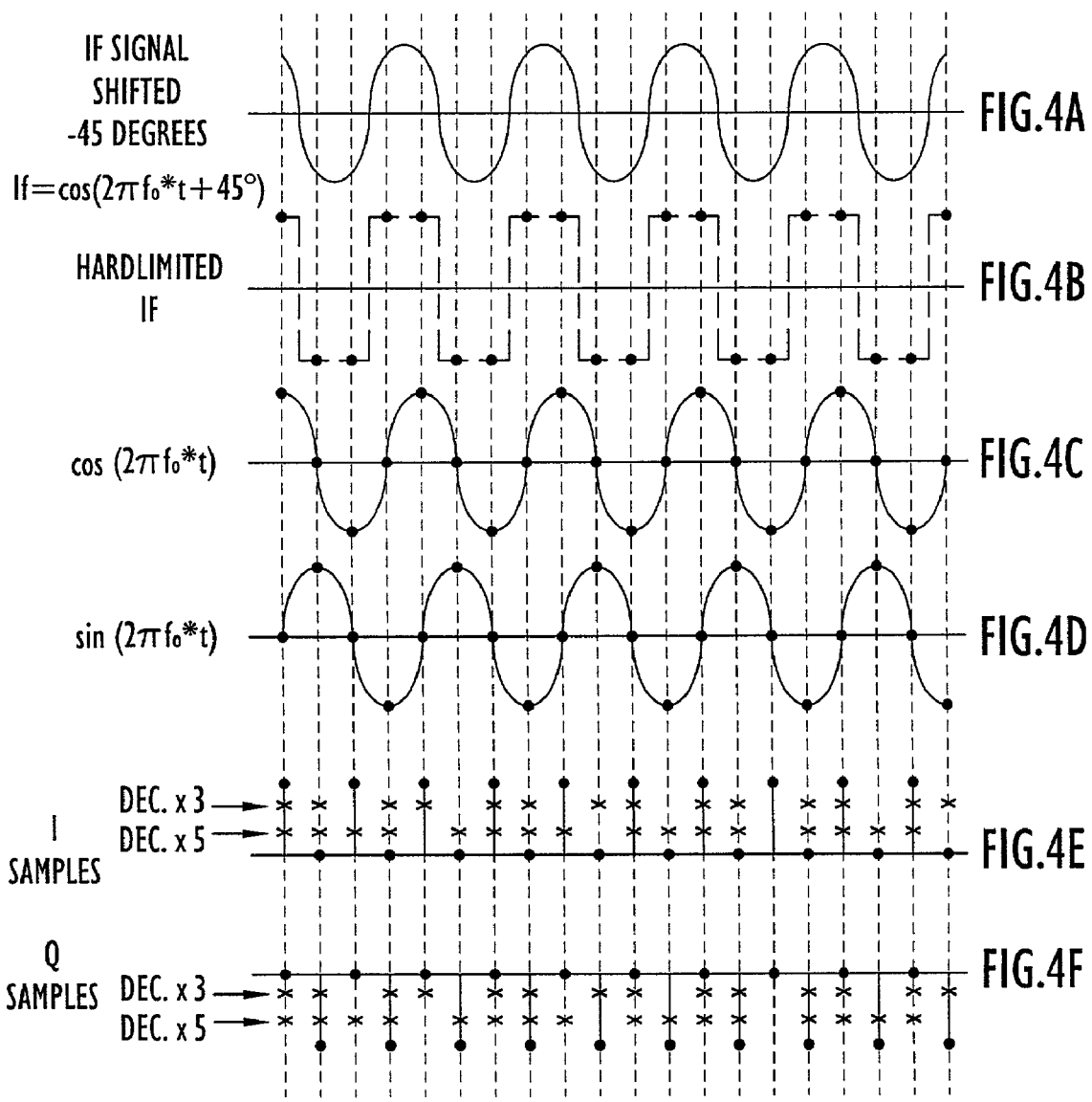
FIGS. 4A–4F present representative timing diagrams depicting the processing of an IF input signal with a phase of −45 degrees relative to a local IF signal, using a sampling rate of four times the IF input signal frequency.
Figure 5:
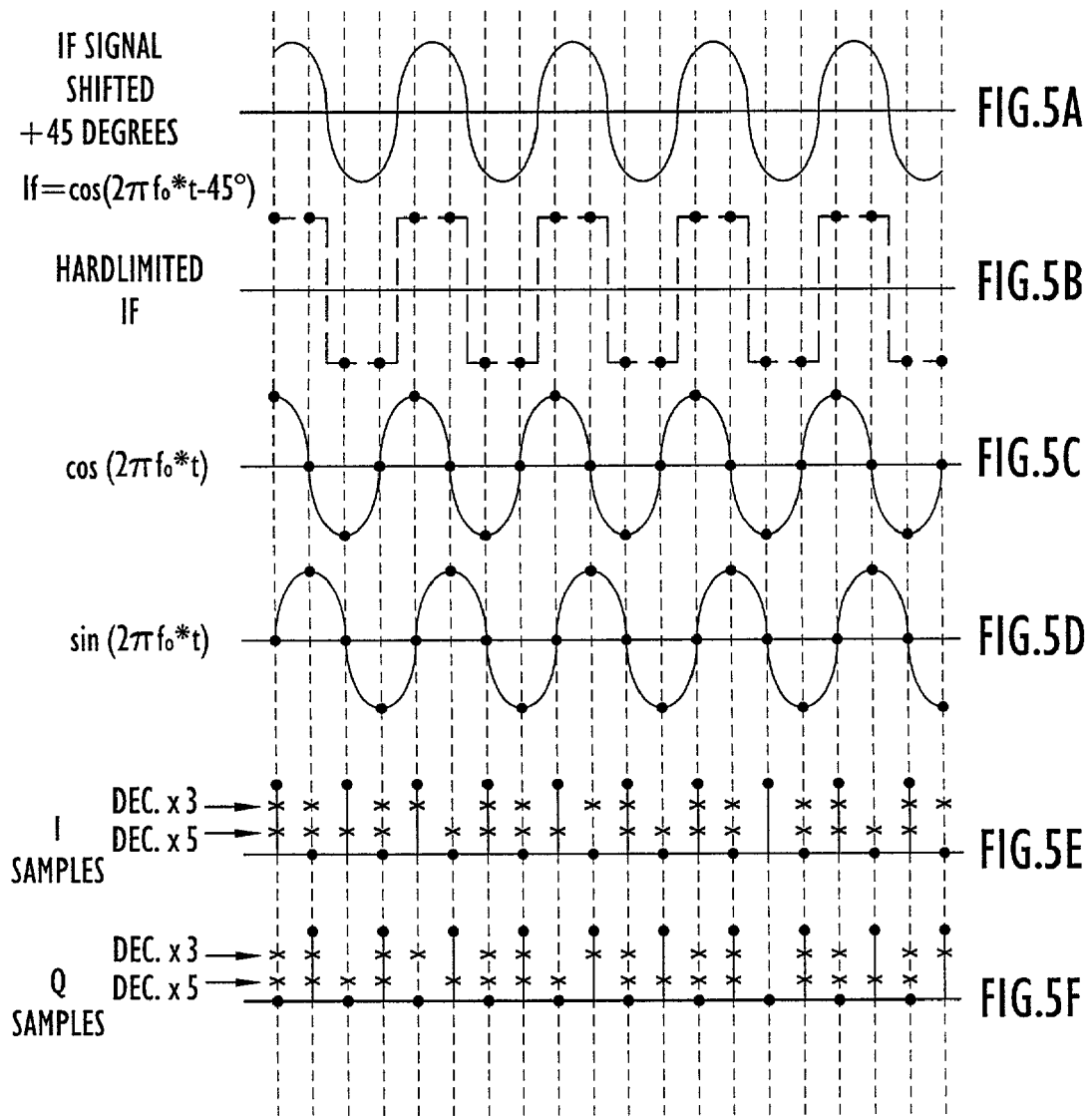
FIGS. 5A–5F present representative timing diagrams depicting the processing of an IF input signal with a phase of +45 degrees relative to a local IF signal, using a sampling rate of four times the IF input signal frequency.
Figure 6:
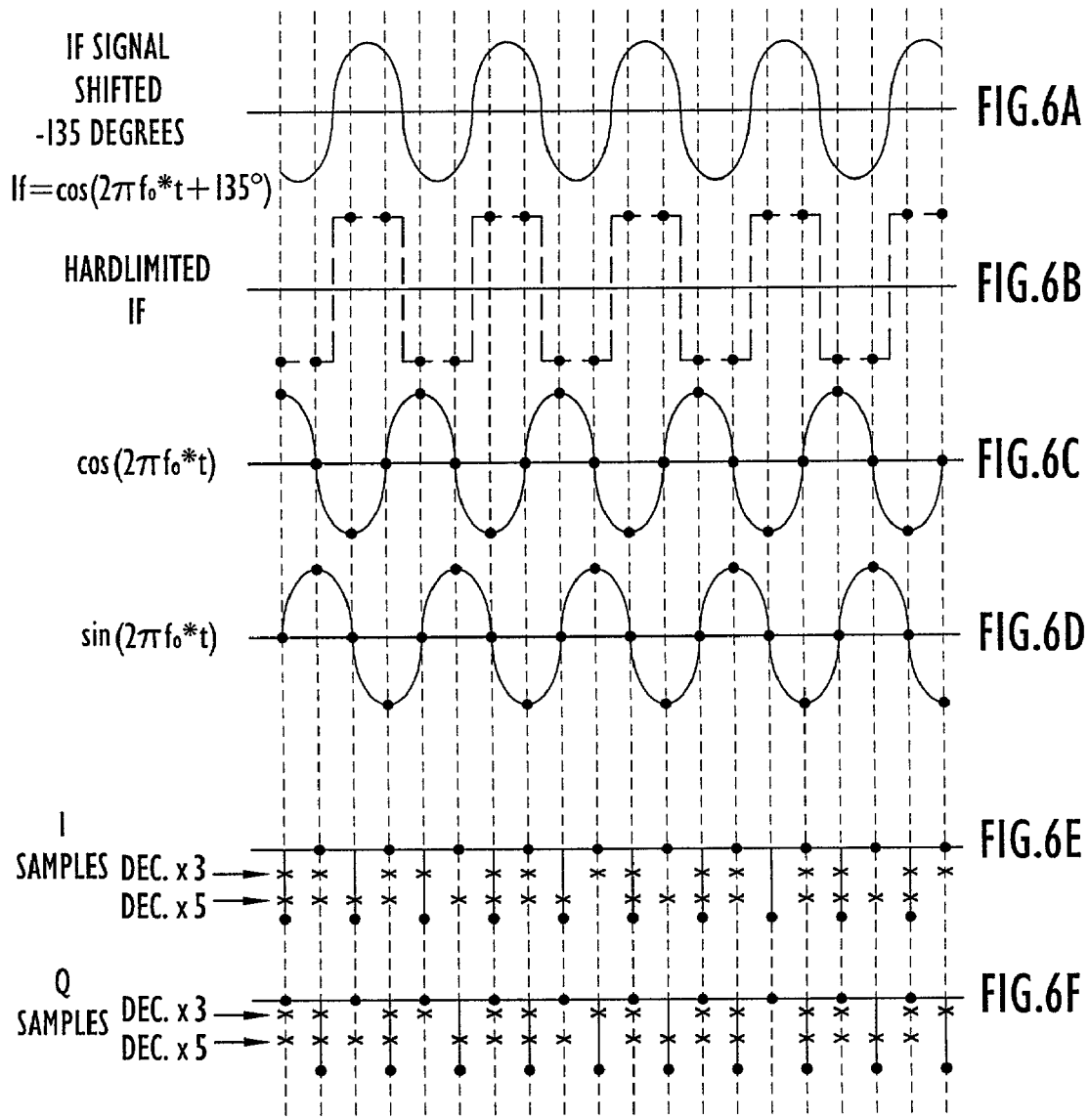
FIGS. 6A–6F present representative timing diagrams depicting the processing of an IF input signal with a phase of −135 degrees relative to a local IF signal, using a sampling rate of four times the IF input signal frequency.
Figure 7:
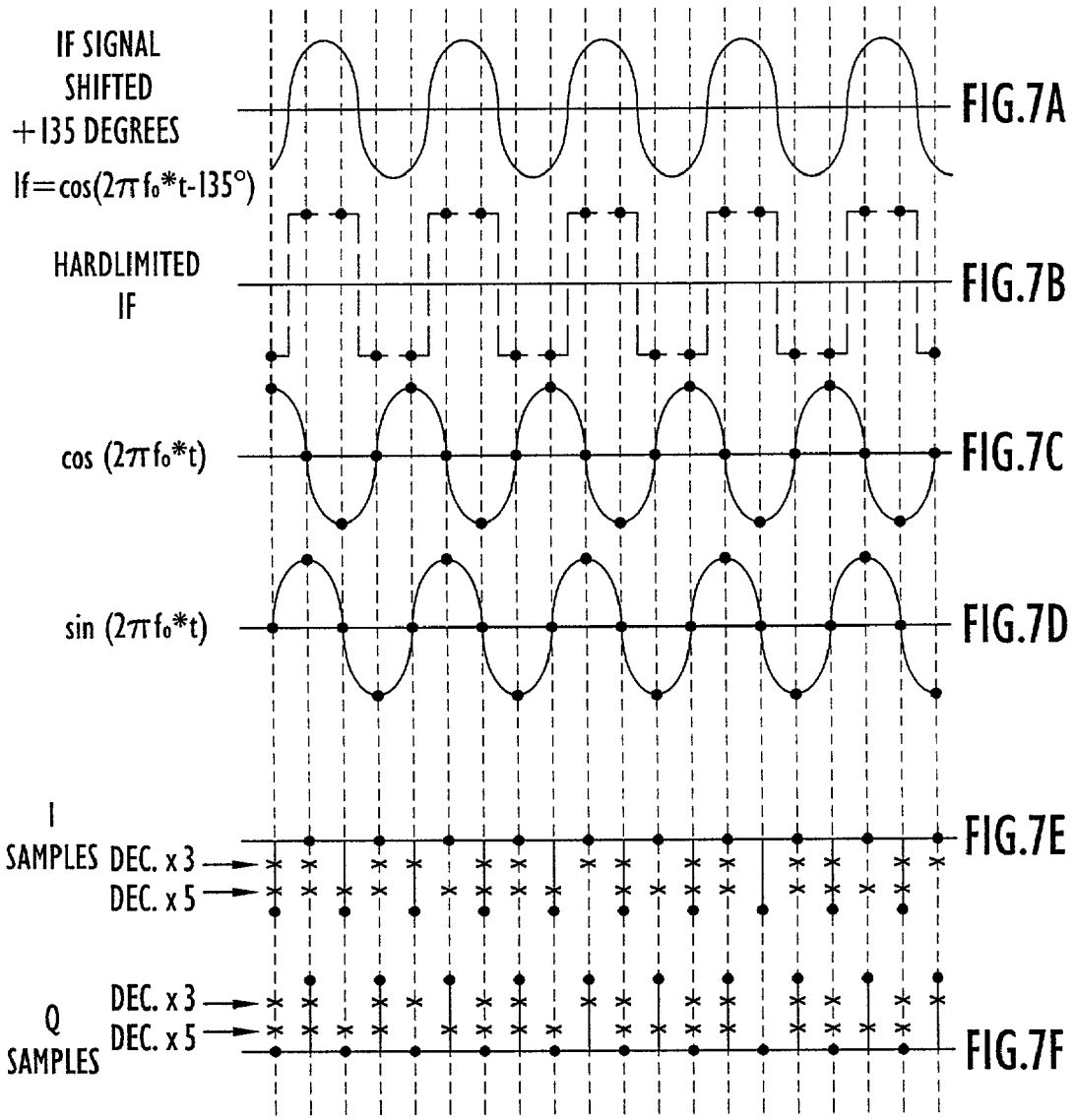
FIGS. 7A–7F present representative timing diagrams depicting the processing of an IF input signal with a phase of +135 degrees relative to a local IF signal, using a sampling rate of four times the IF input signal frequency.

Referring to FIG. 3, an RF frequency signal is received and downconverted by an RF tuner and passed though a bandpass filtered to produce a bandpass filtered IF signal (operation 310). A representative embodiment of such a bandpass filtered IF signal is presented in FIG. 4A. Such a representative signal is not limited to any specific intermediate frequency or to any specific waveform or type of modulation. In fact, as previously discussed, because the present invention does not require the use of an A/D converter, the downconversion techniques of the present invention may be used to downconvert signals at IF frequencies significantly higher than the IF frequencies supported by circuits which do require the use of an A/D converter.

The bandpass IF waveform is then passed through a zero-crossing comparator to generate a hard-limited IF signal (operation 312). A representative embodiment of a hard-limited IF signal generated as a result of operation 312 is presented in FIG. 4B. The generated signal is still a continuous signal of the same frequency as the input signal, but its amplitude has been converted to one of two logical states (e.g., 1 and −1).

Next, at operation 314, the hard-limited IF waveform is sampled at a sampling frequency which is the product of the intermediate frequency and an even integer number greater than or equal to four. For example, if the IF is 455 kHz and a sampling rate of four times the intermediate frequency is used, the hard-limited signal is sampled at 1820 KHz, thereby producing four samples per signal cycle. As previously addressed, representative samples taken at four times IF are depicted in FIG. 4B as solid dots at the intersection of the vertical synchronization lines and the signals they intersect. Although presented within the context of FIG. 4B, once sampled, the generated signal is no longer a continuous, signal. It has been converted to a series of two-state logical samples, representative of the received, continuous hard-limited signal.

The hard-limited IF samples are then processed using two separate transformation processes to generate I and Q component samples (operation 316). As previously discussed, and as indicated by the solid dots at the intersection of the synchronization lines with the respective signals in FIGS. 4C and 4D (which present analog representations of the equations $\cos(2\pi f_0 * t)$ and $\sin(2\pi f_0 * t)$ respectively), the hard-limited IF samples shown in FIG. 4B are logically multiplied by 1, 0, −1, 0 to generate I component samples. Hard-limited IF samples are logically multiplied by 0, 1, 0, −1 to generate Q component samples. Representative embodiments of the resulting I and Q component samples are presented in FIG. 4E and FIG. 4F, respectively. The respective I and Q values represented may be validated by visually multiplying each hard-limited sampled value represented in FIG. 4B by the sampled values of $\cos(2\pi f_0 * t)$, as depicted in FIG. 4C, to obtain each I sample represented in FIG. 4E, and multiplying each hard-limited sampled value represented in FIG. 4B by the sampled values of $\sin(2\pi f_0 * t)$, as depicted in FIG. 4D, to obtain each Q sample represented in FIG. 4F.

I and Q component samples can be optionally reduced, without adversely affecting subsequent information processing, by decimating the I and Q sample sequences by an odd integer, as previously discussed. This optional decimation process (represented in FIG. 3, as step 318, with dashed lines) may be performed for several advantageous reasons such as to reduce processing loads associated with the subsequent low-pass filtering. To demonstrate the effects of decimation upon I and Q samples generated at four times IF, the I and Q samples presented in FIGS. 4E and 4F have been marked with an "x" to illustrate the samples that would be eliminated if the respective I and Q samples were to be decimated by three (upper row) and decimated by five (lower row), respectively. As indicated in FIGS. 4E and 4F with respect to decimation by both three and five, in each case an equal number of correlated samples are eliminated from both the I and Q components to assure symmetric processing of I and Q components in subsequent processing steps and to avoid loss of I and Q phase information.

When selecting an appropriate odd number for use in decimating generated I and Q samples, as described above, the number of samples per IF frequency cycle must be relatively prime to the decimation value. For example, if a signal is sampled at four times the input signal IF frequency, three and five are appropriate decimation values for four-and-three and four-and-five are relatively prime. Likewise, if a signal is sampled at eight times the input signal IF frequency, three and five are also appropriate decimation values for eight-and-three and eight-and-five are relatively prime. If a signal is sampled at twelve times the input signal IF frequency, however, five remains an appropriate decimation values for twelve and five are relatively prime, but three is no longer an appropriate decimation values, since twelve and three are not relatively prime.

Whether or not the I and Q samples are optionally decimated, low-pass filtering of the I and Q component samples is next performed (operation 320) using up/down counters to integrate the respective I and Q components by summing I and Q component sample values over a period of time equal to the bit period. As previously explained in relation to FIG. 2, both I and Q counters can be optionally right shifted (i.e., divided by a multiple of two), as depicted in optional operation 322, to assure that the largest value remains below the upper range of the respective up/down counters and/or to allow the summed values to be represented within a fixed number of bits without loosing I and Q phase information.

Upon summing signal component samples for a single bit-period, the resulting value is dumped to a store and forward FIFO buffer (operation 324). As previously discussed, the nature of the store and forward buffer can be tailored to meet the needs of subsequent processing of the respective I and Q signal components.

FIGS. 5A–5F, FIGS. 6A–6F and FIGS. 7A–7F present signal timing diagrams that are identical in nature to FIGS. 4A–4F, with the exception that while the IF signal in FIGS. 4A, 4B, 4E and 4F depict signals with a phase of −45 degrees relative to a local IF signal $\cos(2\pi f_o^* t)$, FIGS. 5A, 5B, 5E and 5F, FIGS. 6A, 6B, 6E and 6F and 7A, 7B, 7E and 7F, represent signals with relative phases of +45 degrees, −135 degrees and +135 degrees, respectively. As is evident in FIGS. 4E–4F, 5E–5F, 6E–6F, 7E–7F, the phase of the received IF signal significantly affects the I and Q values generated. Similarly, the summed values generated from I or Q samples over a bit period will also be significantly affected by the phase of the received IF signal.

By way of non-limiting representative embodiment, assuming that an IF signal, such as that represented in FIG. 4A has a data rate of 1,600 bits/second and is sampled at 1,820,000 samples/second, resulting in approximately 1,820,000/1,600=1137.5 samples/bit. Assuming minimal impact from signal noise, summation of the approximately 1137 samples associated with the generated I component samples, a subset of which are depicted in FIG. 4E, will result in a large positive number. (e.g., Given that half the sample values are zero, and that all non-zero values are positive, the magnitude of the summed I component value, in the above example, without decimation, can be expected to be in the range of about 1137/2≈+568.) Similarly, summation of the Q samples for a signal having a phase of −45 degrees, a subset of which are depicted in FIG. 4F, will result in a large negative number (e.g., approximately −568).

Figure 8:
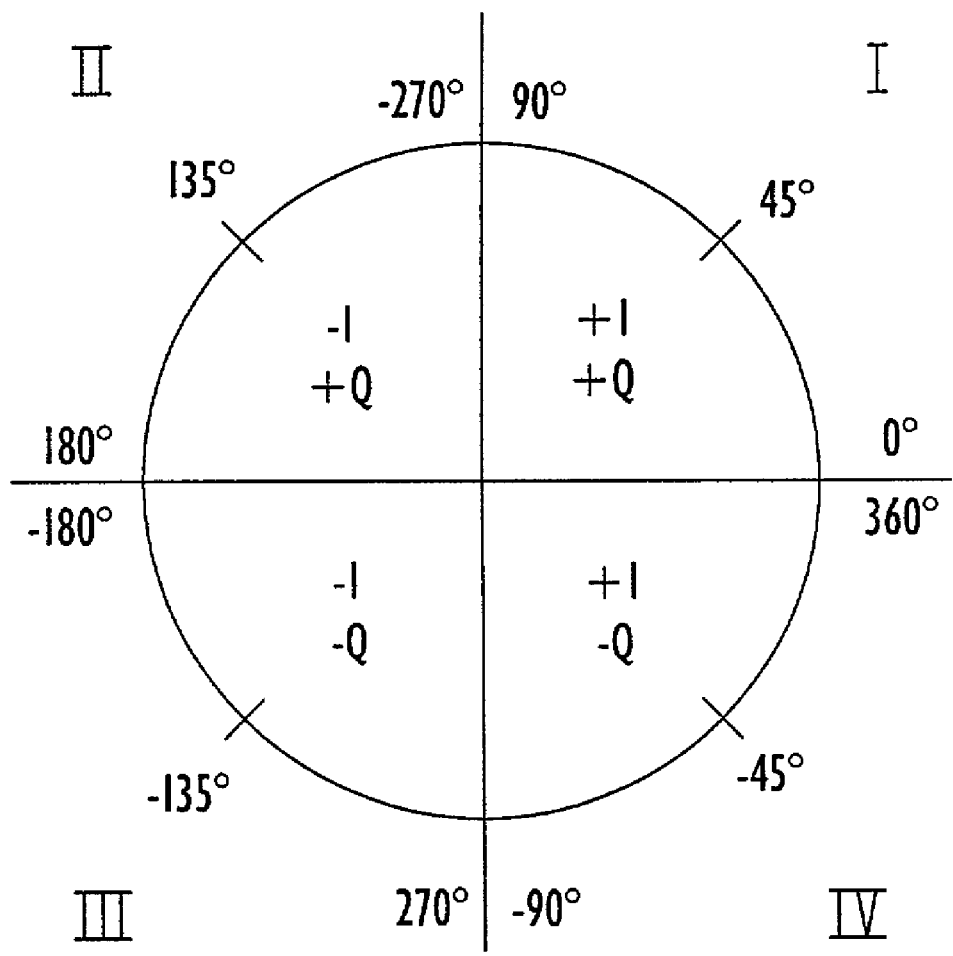
FIG. 8, presents a standard 360 degree plane divided in four quadrants and indicating the positive or negative nature of summed I and Q values for each quadrant.

When the same review is conducted of FIGS. 5E–5F, 6E–6F and 7E–7F, it is apparent that a signal having a phase of +45 degrees relative to the local IF signal (i.e., FIGS. 5E–5F) results in a large positive I sum (+I) and a large positive Q sum (+Q), while a signal having a phase of −135 degrees (i.e., FIGS. 6E–6F) results in a large negative I sum (−I) and a large negative Q sum (−Q), and a signal having a phase of +135 degrees (i.e., FIGS. 7E–7F) results in a large −I and a large +Q. These results are summarized in FIG. 8, which depicts the standard four quadrants of a 360 degree plane. As indicated by FIG. 8, a signal in quadrant I (i.e., with a phase between 0 degrees (alternately represented as 360 degrees) and +90 degrees (alternately represented as −270 degrees)) will have a +I and +Q, while a signal in quadrant I (i.e., a signal with a phase between +90 degrees and +180(alternately represented as −270 degrees)) will have a −I and +Q. Similarly, a signal in quadrant IV (i.e., with a phase between 0 degrees (alternately represented as 360 degrees) and −90 degrees (alternately represented as +270 degrees)) will have a +I and −Q, while a signal in quadrant III (i.e., a signal with a phase between −90 degrees and −180 (alternately represented as +180 degrees)) will have a −I and −Q.

In a noiseless environment, using the techniques consistent with the teachings of this invention, any signal with a phase other that 0 degrees (i.e., 360 degrees), 90 degrees (i.e., −270 degrees), 180 degrees (i.e., −180 degrees) or −90 degrees (i.e., +270), will have very large positive or negative I and Q values (i.e., the magnitude of the values will be approximately one-half the number of samples/bit period remaining at the time of summation, even if optional decimation is used.) Further, in a noiseless environment, the only phase at which the I and Q sums would not equal the maximum possible magnitude would occur at the quadrant boundaries. I sums will be zero at 90 degrees and −90 degrees, while Q sums will be zero at 0 degrees and 180 degrees. Therefore, in a noiseless environment, the phase of the signal can be identified as being in only one of eight states (i.e., within one of the four quadrants, or precisely upon one of the four quadrant boundaries, as previously described).

However, since noise exists in all real operational environments and systems, and with respect to the teachings of the present invention, noise inherent in the received signal allows the phase of a received signal to be more precisely resolved than would be possible in a noiseless case. For example, when the actual phase is close to 0 degrees, for example +5 degrees, noise will result in some fraction of the individual Q component samples included in the value summed for the bit period, to be negative or zero, when in the noiseless case the same values would all have been positive. As a result, the summed Q value will still be positive, but it will not be as large as it would have been in the noiseless case. This reduced magnitude of the Q value, allows the DSP to ascertain that not only is the signal phase in quadrant I, but the phase is closer to 0 degrees that 90 degrees. If the level of noise is relatively stable, the DSP may be calibrated to provide a close estimate of the Q value based upon the actual value of the Q sum generated. In this manner, due to the existence of noise, the value of Q can be more precisely estimated for signal phases that (referring to FIG. 8) lay within 45 degrees of the border between quadrant I and quadrant IV, and within 45 degrees of the border between quadrant II and quadrant III (i.e., for signal with phases between ±45 degrees and ±135 degrees). Similarly due to the existence of noise, the value of I can be more precisely estimated for signal phases which (referring again to FIG. 8) lay within 45 degrees of the border between quadrant I and quadrant II, and within 45 degrees of the border between quadrant III and quadrant IV (i.e., for signal with phases between +45 and +135 degrees and −45 and −135 degrees).

The teachings of the present invention are applicable to the demodulation of any signal in which phase, or changes in signal phase are used to encode information. For example, in differential Binary Phase Shift Keying (BDPSK), a digital signal processor evaluates the summed I and Q value pairs to determine the signal phase for each bit period. The phase for bit period N is then compared to the phase for bit period N−1. If the difference between the signal phases calculated for N and N−1 is closer to zero degrees than 180 degrees, the digital signal process assigns one logical value (e.g., 0) to the demodulated signal. If the difference between the signal phases calculated for N and N−1 is closer to 180 degrees than zero degrees, the digital signal process assigns the opposite logical value (e.g., 1) to the demodulated signal.

The teachings of the present invention are also applicable to other signal modulation techniques in which signal phase, or changes in signal phase are used to encode information. For example, the teachings of the present invention can be used to demodulated Frequency Shift Keying (FSK) and differential FSK modulated signals. Such modulation techniques differ from the Phase Shift Keying (PSK) modulation techniques, addressed above, in that the signal rotates in phase during the bit period rather than staying constant as in PSK. For example, if the deviation in a FSK signal is set to greater than 0.5, the phase will rotate more than 90 degrees in a bit period and appear in two quadrants. The digital signal processor will interpret a shift in the positive direction as one logical value (e.g., 1) and will interpret a shift in the negative direction as another logical value (e.g., 0). If the deviation in a FSK signal is set to greater than 1, the phase will rotate more than 180 degrees in a bit period and appear in three quadrants. The digital signal processor will interpret a shift in the positive direction as one logical value (e.g., 1) and will interpret a shift in the positive direction as another logical value (e.g., 0). In both cases, the phase vector is no longer quantized to very few states (such as the eight associated with PSK in a noiseless environment), for the time that the signal spends in each quadrant determines the average phase angle, because the average number of I counts and Q counts per bit is proportional to the time that I and Q spend in each quadrant.

For example, assume that the deviation in a FSK signal is set to greater than 1 (i.e., that phase will rotate more than 180 degrees in a bit period and appear in three quadrants) and that the phase calculated for the last bit period was −10 degrees. If, during the following bit period, the signal were to swing in the positive direction, the I and Q components would pass through 10 degrees of quadrant IV, 90 degrees of quadrant I, and 80 degrees of quadrant II. Such a change in signal phase over the duration of the bit period would be captured in each of the respective I and Q samples contributing to the respective I and Q sums over the bit period. With respect to the Q component, 170 out of 180 degrees will result in positive Q component samples while 10 out of 180 will result in negative Q values. As a result, the value of Q can be expected to be a relatively high positive number (i.e., in the case of 1375 samples per bit period, with no decimation, approximately $(170/180 \times 1375/2)-(10/180 \times 1375/2) \approx +610$). With respect to the I component 100 out of 180 degrees will result in positive I component samples while 80 out of 180 will result in negative I values, as a result, the value of I can be expected to be a relatively low positive number (i.e., in the case of 1375 samples per bit period, with no decimation, approximately $(100/180 \times 1375/2)-(80/180 \times 1375/2) \approx +76$).

Similarly, assume in the example above that phase calculated for the last bit period was −10 degrees, but during the following bit period the signal swings in the negative direction. As a result, the I and Q components would pass through 80 degrees of quadrant IV, 90 degrees of quadrant III, and 10 degrees of quadrant II. With respect to the Q component, 170 out of 180 degrees will result in negative Q component samples while 10 out of 180 will result in positive Q values, as a result, the value of Q can be expected to be a relatively high negative number (i.e., in the case of 1375 samples per bit period, with no decimation, approximately $-(170/180 \times 1375/2)+(10/180 \times 1375/2) \approx -610$). With respect to the I component 100 out of 180 degrees will result in negative I component samples while 80 out of 180 will result in positive I values, as a result, the value of I can be expected to be a relatively low negative number (i.e., in the case of 1375 samples per bit period, with no decimation, $-(100/180 \times 1375/2)+(80/180 \times 1375/2) \approx -76$). Similar application of the teachings of the present invention can be implemented within a DSP, or similar device, to demodulate virtually any phase or phase shift modulated signal.

As described above, the phase of the IF input signal relative to a local IF signal can be resolved to within ninety degrees, in accordance with the teaching of the present invention, using a sampling rate of four times the IF input signal frequency. Those skilled in the art will recognize, however, that the phase of the IF input signal can be resolved to any practical resolution desired by increasing the sampling rate. For example, by increasing the sampling rate from four to eight samples per IF cycle, the phase resolution of an IF input signal can be reduced from 90 degrees to 45 degrees, without adding noise or dithering.

Figure 9:
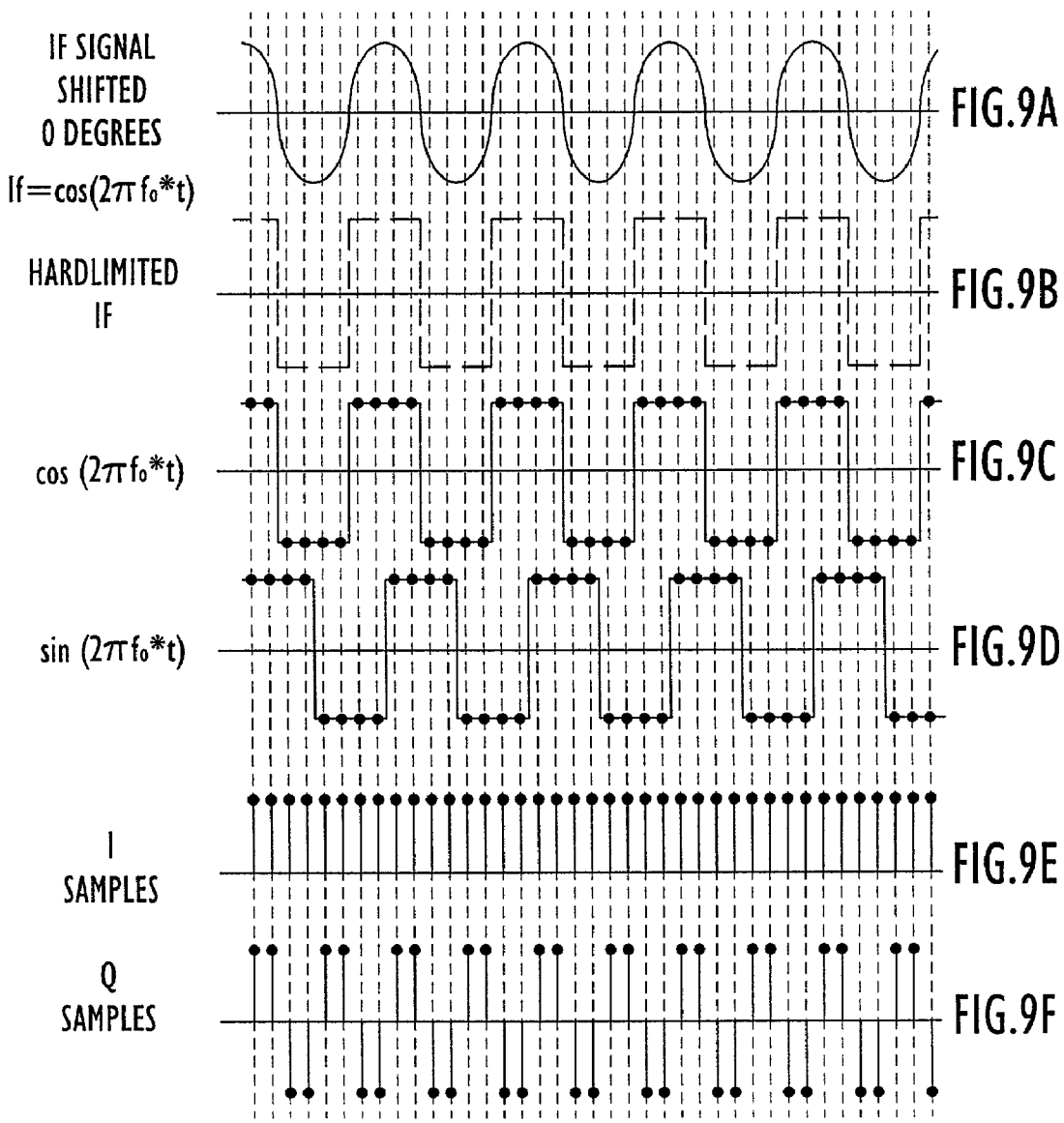
FIGS. 9A–9F present representative timing diagrams depicting the processing of an IF input signal with a phase of +0 degrees relative to a local IF signal, using a sampling rate of eight times the IF input signal frequency.
Figure 10:
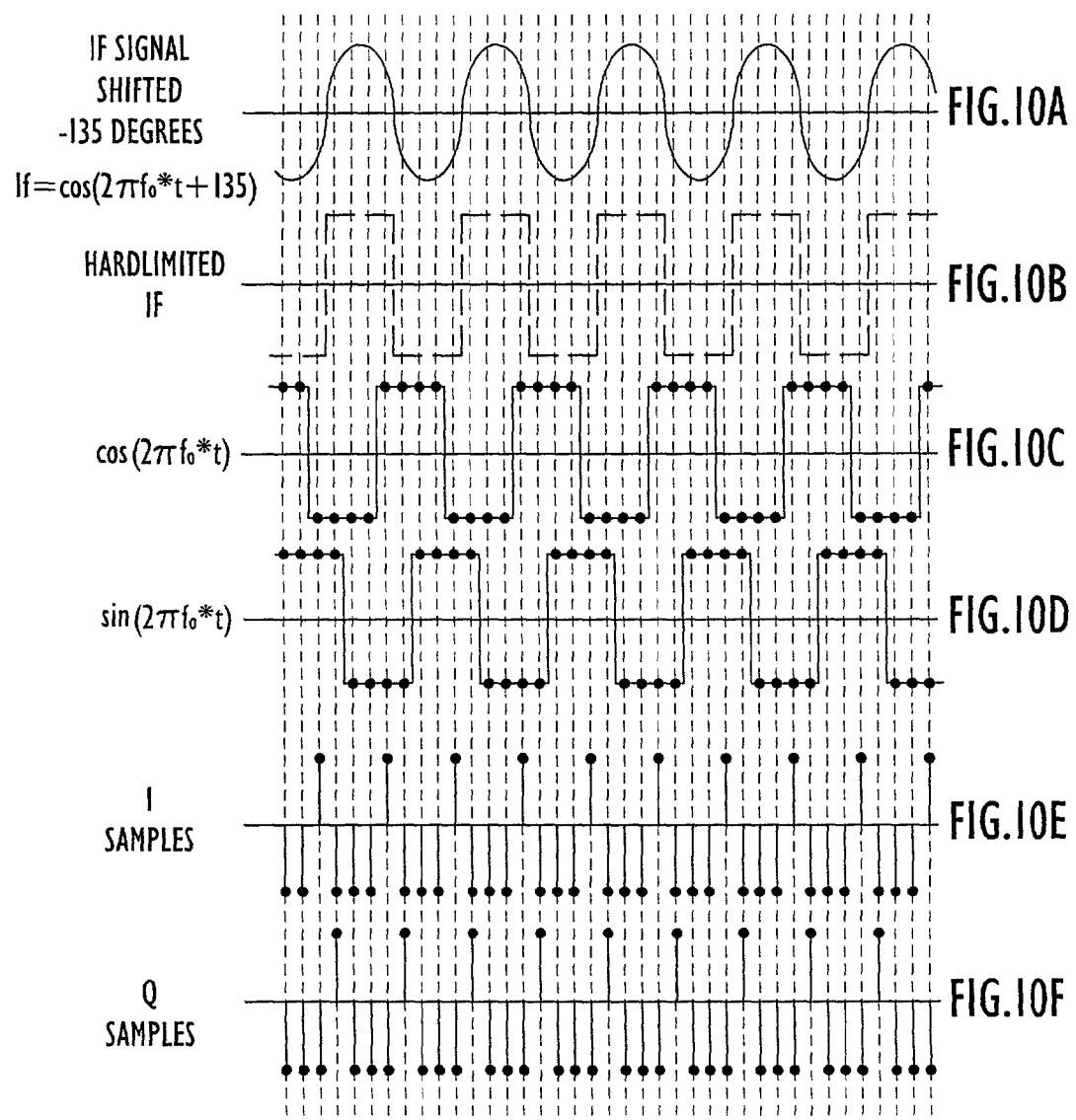
FIGS. 10A–10F present representative timing diagrams depicting the processing of an IF input signal with a phase of −135 degrees relative to a local IF signal, using a sampling rate of eight times the IF input signal frequency.
Figure 11:
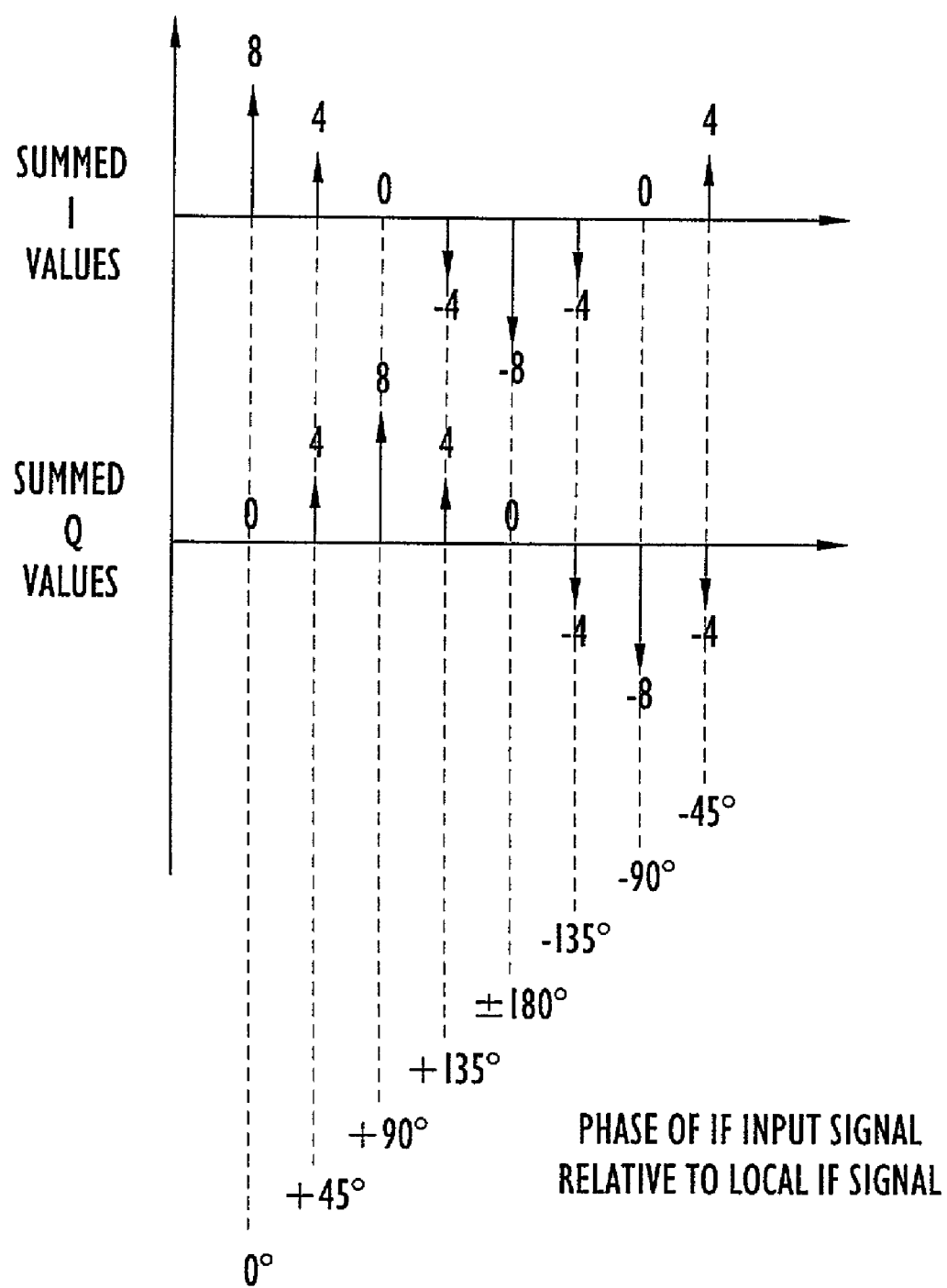
FIG. 11, presents a summary of I and Q sample sums generated for IF input signals with phases of 0, +45, +90, +135, ±180, −135, −90, and −45 degrees relative to a local IF signal, respectively, using a sampling rate of eight times the IF input signal frequency.

FIGS. 9–11 address a third non-limiting representative technique in which resolution of 45 degrees is achieved by sampling at eight times the intermediate frequency. Greater resolution, however, could be achieved with the same technique using a higher sampling frequency which is also the product of the intermediate frequency and an even integer number greater than or equal to four.

FIGS. 9A–9F and FIGS. 10A–10F present representative timing diagrams, similar to those presented in FIGS. 4–7, depicting the processing of IF input signals, using a sampling rate of eight times (rather than four times) the IF input signal frequency and hard-limiting the local IF cosine and sine signals, as represented in FIGS. 9C, 9D, 10C and 10D, respectively. With the exception of the 8 times IF sampling rate and the use of hard-limited local cosine and sine reference signals, the I and Q samples presented in FIGS. 9E–9F and FIGS. 10E–10F are generated using the same techniques described in relation to FIGS. 4–7. Note, however, that in using hard-limited local cosine and sine reference signals to generate I and Q samples from a hard-limited IF input signal respectively, the IF input signal samples are multiplied by repetitive sequences comprised only of successive 1's and −1's.

If the I and Q samples in FIGS. 9E and 9F (associated with an IF input signal with a phase of 0 degrees relative to a local IF signal) are summed over the span of a single signal cycle (i.e., any eight consecutive samples), the resulting values are +8 and 0, respectively. Likewise, if the I and Q samples in FIGS. 10E and 10F (associated with an IF input signal with a phase of −135 degrees relative to a local IF signal) are summed over the span of a single signal cycle, the resulting values are −4 and −4, respectively. In fact, I and Q sums, generated in accordance with the teachings of the present invention, directly reflect the phase of the IF input signal relative to a local IF signal.

FIG. 11 presents I and Q sums, summed over the span of a single signal cycle (i.e., any eight consecutive samples), generated for IF input signals with phases of 0, +45, +90, +135, ±180, −135, −90, and −45, respectively, relative to a local IF signal. As indicated in FIG. 11, shifting the input signal presented in FIG. 9 to the right by ⅛ cycle (i.e., to +45 degrees) causes the I output to go to +4 and the Q output to +4. Shifting the input signal presented in FIG. 9 to the right by ¼ cycle (i.e., to +90 degrees) causes the I output to go to 0 and the Q output to +8.

FIG. 11 demonstrates that the phase of an IF input signal relative to a local IF signal can be determined based upon the respective I and Q sums. For example, the I and Q sums for the respective signal phases within a single cycle can be determined as described in relation to FIG. 11. The number of signal cycles per bit period can be determined by multiplying the input signal frequency times the bit period. The expected counter value resulting from counting the I and Q samples, respectively, over a single bit period, therefore, is the number of cycles per bit period times each of the respective single cycle I and Q sums. To determine the phase of an IF input signal relative to a local IF signal, the demodulation processor merely compares the dumped I and Q sums generated for a bit period with the expected sums associated with each of the possible signal phases, and selects the closest match.

In accordance with the present invention IF to baseband I and Q downconversion techniques known in the prior art are dramatically improved in several significant ways. The expensive, power-consuming A/D converter and associated AGC circuit are replaced with a low-cost, low-power, zero-crossing comparator by using a zero-crossing comparator to create a hard-limited signal at the IF signal frequency which is directly input to the digital section of a FPGA or ASIC or similar device. These 1-bit samples are used to form the I and Q signals, replacing conventional twelve-bit samples and dramatically reducing the gate complexity required for processing the signals. Further, by sampling hard-limited signal at a sampling frequency which is the product of the intermediate frequency and an even integer number greater than or equal to four (i.e., where the time at sampling, t, corresponds to $t=n*1/(m*f_o)$ where n is a successively increasing positive integer representing the sample number, and m is an even integer greater than or equal to four), multiplication by $\cos(2\pi f_o*t)$ and $\sin(2\pi f_o*t)$ required to generate I and Q baseband signal components is greatly reduced. Given that the IF signal itself has been hard-limited to two separate logical states or voltage levels (e.g., −1 and 1), the complex twelve-bit multiplication operations which would ordinarily required complex gated logic to implement, can be reduced to simple gated logic. Additionally, using sample decimation, generated I and Q signal components can be significantly reduced by systematically eliminating paired samples in both the I and Q components, without loss of I/Q phase information. Decimation can be used to greatly reduce the effort to perform subsequent lowpass filtering of the I and Q component signals. Moreover, because the I and Q component samples generated in accordance with the present invention consist solely of the values 1, 0 and −1, low-pass filtering of generated I and Q signals, typically performed in the prior art using multi-bit multiplication and addition operations implemented within FPGA or ASIC devices with heavy gate counts, can be performed with simple up/down counters.

Two techniques are described which can be used in connection with the IF to baseband downconversion techniques of the present invention to further increase the quality of the generated I and Q component signals. First, a bit sync adjust feature allows programmable up/down counters to be coordinated so that tracking between I and Q bit periods and their respective I and Q input streams can be precisely controlled, based upon constant monitoring of previously generated I and Q output samples. Second, an "n and cycle type" feature allows the number of input samples included within a single I and Q bit period duration to be automatically calculated and dynamically adjusted. Used in conjunction with one another, the bit sync adjust and the n and cycle type features allow programmable up/down counters to be optimally aligned with the hard-limited I and Q input streams regardless of dynamic fluctuations in input data rates and sampling rates employed, and other signal timing discrepancies, thereby optimizing the accuracy of the resulting low-pass filtered I and Q samples at baseband and allowing the disclosed downconversion techniques to be used in a wide variety of dynamic operational environments. Nevertheless, the bit sync adjust and the n and cycle type features are optional. If the characteristics of the signal to be received are well known and stable, the added complexity of programmable up/down counters and the bit sync adjust and the n and cycle type features may be omitted without detracting from the benefits associated with the downconversion techniques of the present invention.

By applying the above combination of techniques to the IF down conversion process, the present invention greatly simplifies a previously complex process and provides substantial savings with respect to implementation device complexity, cost, and power consumption. Furthermore, by eliminating the use of A/D converters, the present invention can be used to downconvert input signals at intermediate frequencies that far exceed the processing speed of multi-bit A/D converters typically employed with traditional IF downconversion techniques. The present invention allows as much of the IF to baseband down conversion process as possible to be conducted in the digital realm. As a result, the processing techniques associated with the present invention can be implemented using discrete digital logic, implemented as a single low-cost integrated circuit produced as a stand-alone chip, or combined with additional integrated circuitry as part of a more complex chip. Regardless of the physical embodiment, the present invention allows provides a highly effective means for providing IF to baseband conversion for a wide range of phase modulated and frequency modulated signals.

The present invention offers a very inexpensive and cost effective IF to baseband down conversion solution applicable to most phase and frequency modulated systems including a wide range of devices including radios, cell phones, two-way transceivers, pagers, transponders and other devices. If the signal to noise is positive (i.e., the signal is above the noise) the present invention can be used with no signal loss. If the signal is below the noise, the hard-limited approach discussed in this application will suffer only up to a 1db loss. In applications where such performance is operationally acceptable, the present invention offers numerous cost and performance advantages. A processor designed in accordance with the present invention can operate at high data rates due to its simple processing and small number of gates. The approach can be used in military radios as part of a FSK, PSK, DPSK, or similar frequency or phase demodulation system.

Having described preferred embodiments of new and improved method and apparatus for downconverting from I/F to baseband, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of downconverting an intermediate frequency (IF) signal to baseband in-phase and quadrature signals, comprising:
   generating a hard-limited signal from the IF signal;
   sampling the hard-limited signal at a rate that is substantially a multiple of the intermediate frequency to produce hard-limited signal samples;
   generating in-phase samples from the hard-limited signal samples;
   generating quadrature samples from the hard-limited signal samples;
   digitally summing the in-phase samples over a predetermined period, thereby producing a digital representation of an in-phase baseband signal; and
   digitally summing the quadrature samples over a predetermined period, thereby producing a digital representation of a quadrature baseband signal.

2. The method of claim 1, wherein the hard-limited signal is sampled at a rate that is substantially a product of multiplying the intermediate frequency and an even number greater than or equal to four.

3. The method of claim 1, wherein the in-phase samples are generated by transforming the hard-limited signal samples according to a first predetermined sequence and the quadrature phase samples are generated by transforming the hard-limited signal samples according to a second predetermined sequence.

4. The method of claim 3, wherein the first predetermined sequence is 1, 0, −1, and 0 and the second predetermined sequence is 0, 1, 0, and −1.

5. The method of claim 1, wherein the in-phase samples are generated by zeroing alternate hard-limited signal samples and changing the sign of alternate non-zeroed hard-limited signal samples, and wherein the quadrature samples are generated by zeroing alternate hard-limited signal samples and changing the sign of alternate non-zeroed hard-limited signal samples.

6. The method of claim 1, wherein prior to summing, the in-phase and quadrature samples are decimated by an odd number.

7. The method of claim 1, wherein summing the in-phase and quadrature samples is performed with an up/down counter.

8. The method of claim 1, wherein summing the in-phase and quadrature samples performs low pass filtering.

9. The method of claim 1, wherein both the in-phase and quadrature sums are divided by a multiple of two if either of the in-phase and quadrature sums exceeds a maximum threshold.

10. The method of claim 1, wherein the predetermined period is a bit period and wherein summing the in-phase and quadrature samples over the duration of a bit period produces an I sum and a Q sum that are representative of the in-phase and quadrature signal components, respectively, during that bit period.

11. The method of claim 10, wherein the in-phase and quadrature samples are summed, respectively, over the duration of a fraction of a bit period.

12. The method of claim 1, wherein the in-phase samples are summed by a plurality of counters during overlapping time periods, and the quadrature samples are summed by a plurality of counters during the overlapping time periods.

13. The method of claim 12, wherein the overlapping time periods are offset from each other by a predetermined number of samples.

14. The method of claim 12, further comprising:
   aligning bit period boundaries using sums generated by the plurality of in-phase and quadrature counters.

15. The method of claim 1, wherein the intermediate frequency signal is a phase modulated signal.

16. The method of claim 15, wherein the intermediate frequency signal is a Phase Shift Key (PSK) modulated signal.

17. The method of claim 1, wherein the intermediate frequency signal is a frequency modulated signal.

18. The method of claim 17, wherein the intermediate frequency signal is a Frequency Shift Key (FSK) modulated signal.

19. An apparatus for downconverting an intermediate frequency (IF) signal to baseband in-phase and quadrature signals, comprising:
   a comparator responsive to the IF signal that generates a hard-limited signal;
   a sampling circuit configured to sample the hard-limited signal at a rate that is substantially a multiple of the intermediate frequency;
   an in-phase signal generator configured to generate in-phase signal samples based upon the sampled hard-limited signal;
   a quadrature signal generator configured to generate quadrature signal samples based upon the sampled hard-limited signal;
   an in-phase counter that digitally sums the in-phase signal samples over a predetermined period, thereby producing a digital representation of an in-phase baseband signal; and
   a quadrature counter that digitally sums the quadrature signal samples over a predetermined period, thereby producing a digital representation of a quadrature baseband signal.

20. The apparatus of claim 19, wherein the sampling circuit samples the hard-limited signal at a rate that is substantially a product of multiplying the intermediate frequency and an even number greater than or equal to four.

21. The apparatus of claim 19, wherein the in-phase signal generator is configured to generate the in-phase signal by transforming the hard-limited signal according to a first predetermined sequence, and the quadrature phase signal generator is configured to generate the quadrature phase signal by transforming the hard-limited signal according to a second predetermined sequence.

22. The apparatus of claim 21, wherein the first predetermined sequence is 1, 0, −1, and 0, and the second predetermined sequence is 0, 1, 0, and −1.

23. The apparatus of claim 19, wherein the in-phase signal generator zeroes alternate hard-limited signal samples and changes the sign of alternate non-zeroed hard-limited signal samples, and wherein the quadrature signal generator zeroes alternate hard-limited signal samples and changes the sign of alternate non-zeroed hard-limited signal samples.

24. The apparatus of claim 19, further comprising an in-phase decimator and a quadrature decimator which respectively decimate the in-phase and quadrature samples by an odd number prior to summing.

25. The apparatus of claim 19, wherein the in-phase and quadrature counters are up/down counters.

26. The apparatus of claim 19, wherein the in-phase counter and quadrature counter perform low pass filtering.

27. The apparatus of claim 19, wherein both the in-phase counter and quadrature counter divide generated sums by a multiple of two if either of the in-phase and quadrature sums exceeds a maximum threshold.

28. The apparatus of claim 19, wherein the predetermined period is a bit period and wherein the in-phase and quadrature counters sum the in-phase and quadrature samples over the duration of a bit period to produce an I sum and a Q sum that are representative of the in-phase and quadrature signal components, respectively, during that bit period.

29. The apparatus of claim 28, wherein the in-phase counter and quadrature counter sum in-phase and quadrature samples, respectively, over the duration of a fraction of a bit period.

30. The apparatus of claim 19, further comprising a plurality of in-phase counters which respectively sum the in-phase samples during overlapping time periods, and a plurality of quadrature counters which respectively sum the quadrature samples during the overlapping time periods.

31. The apparatus of claim 30, wherein the overlapping time periods are offset from each other by a predetermined number of samples.

32. The apparatus of claim 30, further comprising a signal processor responsive to the in-phase and quadrature baseband signals produced by the in-phase and quadrature counters to generate a baseband signal, wherein said signal processor aligns bit period boundaries of the baseband signal using sums generated by the plurality of in-phase and quadrature counters.

33. The apparatus of claim 19, further comprising a signal processor responsive to the in-phase and quadrature baseband signals produced by the in-phase and quadrature counters to generate a demodulated signal.

34. The apparatus of claim 19, wherein the intermediate frequency signal is a phase modulated signal.

35. The apparatus of claim 34, wherein the intermediate frequency signal is a Phase Shift Key (PSK) modulated signal.

36. The apparatus of claim 19, wherein the intermediate frequency signal is a frequency modulated signal.

37. The apparatus of claim 36, wherein the intermediate frequency signal is a Frequency Shift Key (FSK) modulated signal.

38. An apparatus for downconverting an intermediate frequency (IF) signal to baseband in-phase and quadrature signals, comprising:

means for generating a hard-limited signal;
means for sampling the hard-limited signal at a rate that is substantially a multiple of the intermediate frequency;
means for generating in-phase signal samples based upon the sampled hard-limited signal;
means for generating quadrature signal samples based upon the sampled hard-limited signal;
means for digitally summing the in-phase signal samples over a predetermined period, thereby producing a digital representation of an in-phase baseband signal; and
means for digitally summing the quadrature signal samples over a predetermined period, thereby producing a digital representation of a quadrature baseband signal.

39. The apparatus of claim 38, wherein said means for sampling the hard-limited signal samples the hard-limited signal at a rate that is substantially a product of multiplying the intermediate frequency and an even number greater than or equal to four.

40. The apparatus of claim 38, wherein the means for generating in-phase signal samples generates the in-phase signal samples by transforming the hard-limited signal according to a first predetermined sequence, and the means for generating quadrature phase signal samples generates the quadrature signal samples by transforming the hard-limited signal according to a second predetermined sequence.

41. The apparatus of claim 40, wherein the first predetermined sequence is 1, 0, −1, and 0, and the second predetermined sequence is 0, 1, 0, and −1.

42. The apparatus of claim 38, wherein the means for generating in-phase signal samples zeroes alternate hard-limited signal samples and changes the sign of alternate non-zeroed hard-limited signal samples, and wherein the means for generating quadrature signal samples zeroes alternate hard-limited signal samples and changes the sign of alternate non-zeroed hard-limited signal samples.

43. The apparatus of claim 38, further comprising means for decimating the in-phase signal and means for decimating the quadrature signal which respectively decimate the in-phase and quadrature signal samples by an odd number prior to summing.

44. The apparatus of claim 38, wherein the means for summing the in-phase signal samples and the means for summing the quadrature signal samples perform low pass filtering.

45. The apparatus of claim 38, wherein both the means for summing the in-phase signal samples and the means for summing the quadrature signal samples divide generated sums by a multiple of two if either of the in-phase and quadrature sums exceeds a maximum threshold.

46. The apparatus of claim 38, wherein the predetermined period is a bit period and wherein the means for summing the in-phase signal samples and means for summing the quadrature signal samples respectively sum the in-phase and quadrature samples over the duration of a bit period to produce an I sum and a Q sum that are representative of the in-phase and quadrature signal components, respectively, during that bit period.

47. The apparatus of claim 46, wherein the means for summing the in-phase signal samples, and the means for summing the quadrature signal samples, sum in-phase and quadrature samples, respectively, over the duration of a fraction of a bit period.

48. The apparatus of claim 38, further comprising means for processing in-phase and quadrature baseband signals to generate a baseband demodulated signal.

49. The apparatus of claim 38, wherein the intermediate frequency signal is a frequency modulated signal.

50. The apparatus of claim 49, wherein the intermediate frequency signal is a Frequency Shift Key (FSK) modulated signal.

51. The apparatus of claim 38, wherein the intermediate frequency signal is a phase modulated signal.

52. The apparatus of claim 51, wherein the intermediate frequency signal is a Phase Shift Key (PSK) modulated signal.

53. A receiver for processing a received RF signal, comprising:
   an RF tuner for downconverting the received RF signal to an intermediate frequency (IF) signal;
   an IF processor comprising: a comparator responsive to the IF signal to generate a hard-limited signal; a sampling circuit configured to sample the hard-limited signal at a rate that is substantially a multiple of the intermediate frequency; in-phase and quadrature signal generators configured respectively to generate in-phase and quadrature signals samples based upon the sampled hard-limited signal; in-phase and quadrature counters configured respectively to digitally sum the in-phase and quadrature signal samples over a predetermined period, thereby producing digital in-phase and quadrature baseband signals; and
   a baseband processor configured to produce an information signal in response to the digital in-phase and quadrature baseband signals.

54. The receiver of claim 53, wherein the sampling circuit samples the hard-limited signal at a rate that is substantially a product of multiplying the intermediate frequency and an even number greater than or equal to four.

55. The receiver of claim 53, wherein the in-phase signal generator is configured to generate the in-phase signal by transforming the hard-limited signal according to a first predetermined sequence, and the quadrature phase signal generator is configured to generate the quadrature phase signal by transforming the hard-limited signal according to a second predetermined sequence.

56. The receiver of claim 55, wherein the first predetermined sequence is 1, 0, −1, and 0, and the second predetermined sequence is 0, 1, 0, and −1.

57. The receiver of claim 53, wherein the in-phase signal generator zeroes alternate hard-limited signal samples and changes the sign of alternate non-zeroed hard-limited signal samples, and wherein the quadrature signal generator zeroes alternate hard-limited signal samples and changes the sign of alternate non-zeroed hard-limited signal samples.

58. The receiver of claim 53, further comprising an in-phase decimator and a quadrature decimator which respectively decimate the in-phase and quadrature samples by an odd number prior to summing.

59. The receiver of claim 53, wherein the in-phase and quadrature counters are up/down counters.

60. The receiver of claim 53, wherein the in-phase counter and quadrature counter perform low pass filtering.

61. The receiver of claim 53, wherein both the in-phase counter and quadrature counter divide generated sums by a multiple of two if either of the in-phase and quadrature sums exceeds a maximum threshold.

62. The receiver of claim 53, wherein the predetermined period is a bit period and wherein the in-phase and quadrature counters sum the in-phase and quadrature samples over the duration of a bit period to produce an I sum and a Q sum that are representative of the in-phase and quadrature signal components, respectively, during that bit period.

63. The receiver of claim 62, wherein the in-phase counter and quadrature counter sum in-phase and quadrature samples, respectively, over the duration of a fraction of a bit period.

64. The receiver of claim 53, further comprising a plurality of in-phase counters which respectively sum the in-phase samples during overlapping time periods, and a plurality of quadrature counters which respectively sum the quadrature samples during the overlapping time periods.

65. The receiver of claim 53, further comprising a signal processor responsive to the in-phase and quadrature baseband signals produced by the in-phase and quadrature counters to generate a demodulated signal.

66. The receiver of claim 53, wherein the intermediate frequency signal is a phase modulated signal.

67. The receiver of claim 66, wherein the intermediate frequency signal is a Phase Shift Key (PSK) modulated signal.

68. The receiver of claim 53, wherein the intermediate frequency signal is a frequency modulated signal.

69. The receiver of claim 68, wherein the intermediate frequency signal is a Frequency Shift Key (FSK) modulated signal.

* * * * *